United States Patent [19]
Moré

[11] Patent Number: 5,180,645
[45] Date of Patent: Jan. 19, 1993

[54] INTEGRAL SOLID STATE EMBEDDED POWER SUPPLY

[75] Inventor: Georgina Moré, Delray Beach, Fla.

[73] Assignee: Motorola, Inc., Schaumburg, Ill.

[21] Appl. No.: 662,598

[22] Filed: Mar. 1, 1991

[51] Int. Cl.[5] .............................................. H01M 2/22
[52] U.S. Cl. .................................. 429/127; 429/163;
429/192; 455/347
[58] Field of Search ................. 429/98, 127, 152, 163,
429/192; 455/347

[56] References Cited

U.S. PATENT DOCUMENTS

| | | | |
|---|---|---|---|
| 2,523,354 | 9/1950 | Butler | 429/98 |
| 4,822,701 | 4/1989 | Ballard et al. | 429/192 |
| 5,019,467 | 5/1991 | Fujiwara | 429/127 |
| 5,019,468 | 5/1991 | Miyabayashi | 429/192 X |

OTHER PUBLICATIONS

*Material Engineering* journal, Aug. 1985 issue, p. 35, Table 1, shows a list of conductive polymers under development.

ASDr. S. D. Bhakta of the Materials Research Laboratory of SRI International at the Electrochemical Society Meeting in Seattle, Washington, on Oct. 14–19, 1990.

Meilin Liu, Steven J. Visco, and Lutgard C. De Jonghe in their paper titled "All-Solid State Thin Film Rechargeable Lithium Batteries Using Solid Redox Polymerization Electrodes" submitted to the University of California.

Article titled "Polymer Solid Electrolytes Eyed for High Energy Density Battery," Nov. 5, (1984), edition of the *C&E News*.

*Primary Examiner*—Stephen Kalafut
*Attorney, Agent, or Firm*—Pablo Meles

[57] ABSTRACT

A battery (10) integrally formed in a substrate (2) comprises a first current collector (4) inlaid in the substrate (2) and further coupled to a first electrode (14), a second current collector (6) coupled to a second electrode (16), and a solid state electrolyte (8) between the first electrode (14) and the second electrode (16).

19 Claims, 3 Drawing Sheets

INTEGRAL SOLID STATE EMBEDDED POWER SUPPLY

TECHNICAL FIELD

This invention relates generally to batteries, and more specifically to a solid state battery inlaid in a product housing or substrate.

BACKGROUND

Power supplies in numerous portable products typically take up a substantial portion of the weight and volume of the portable product as a whole. The trend towards less voluminous and lighter power supplies is ever so evident in the communications industry. Thus, any further development that would decrease the overall weight and size of the power supply while maintaining (or increasing) the same charge capacity and life span of present packaged cell batteries would provide a distinct advantage. Typical batteries, such as nickel cadmium batteries, have at least one Ni-Cd cell. Each cell requires a metal casing enclosing a positive and a negative electrode, electrolyte, metal current collectors, and insulators. The term battery is occasionally used to identify a cell. However, it is more correctly used to identify a group of individual cells assembled in a pack with terminals (for electrical contact) and proper insulation such as a plastic housing for the battery pack containment. All this packaging results in an inefficient use of energy per unit volume of power source.

Today, in order to achieve the appropriate voltage and/or capacity requirements for portable products such as two-way radios and cellular phones, a string of individual cells (each usually contained in a metal can) is coupled serially or in parallel. The main reason for containment in the cell metal casing is the use of liquid electrolyte. This eliminates the risk of contamination of the portable product equipment from electrolyte leakage. Each cell's metal can is insulated in thin plastic heat shrink wrap to prevent shorting on contact with each other before insertion into the plastic housing. Each cell is then coupled typically using nickel or plated tabs, and then finally the cell pack is held within a hard plastic housing.

With the advent of solid electrolyte and solid conductive polymer materials, a new foundation for battery technology was laid. Conductive polymer materials are semiconductors in their natural state, but they can become conductive when doped (treated) with electron donor materials, i.e., alkali metals, or with electron acceptor materials, i.e., $I_2$, $AsF_5$, $SO_3$, $HSO_3F$. These conductive polymers or plastics have a ring structure with delocalized $\pi$ bonding electrons which are relatively free to move about the polymer chain structure. Conductive polymers such as polyphenylene, polypyrrole, and polyaniline have been used as electrode materials. Polyaniline and its derivatives, in particular, have become of greater interest because of their higher stability in air and their ease of reproducibility. Some of these polymers can be made into thin flexible films which can be shaped or molded into convenient shapes for design compatibility. In addition to the conductive polymer electrodes, polymer electrolytes have been developed which can also be fabricated in thin plastic sheets. Some examples include polyethyleneoxide (PEO), polyphosphazene, polyether-substituted phosphazene (MEEP), and polypropyleneoxide. A list of conductive polymers under development can be found in *Material Engineering* journal, August 1985 issue. page 35, Table 1.

These solid state batteries have the one drawback of low conductivity at normal or ambient operating temperatures. This limits the current rate capability that can be obtained from the system. However, conductivities in the order of $10^{-4}/\Omega-cm$ at room temperatures have been attained in laboratories, which are sufficient for some battery applications such as computer memory back-up and memory cards. Solid polymers made into thin films can provide higher rate capabilities by increasing surface area significantly. Therefore, voltages and capacities are obtained which widen the range of applications for thin film solid state batteries. In addition to the solid state batteries mentioned, some type of supercapacitors can also be used as power sources. Recently, a paper presented by Dr. S. D. Bhakta of the Materials Research Laboratory of SRI International at the Electrochemical Society Meeting in Seattle, Wash., on Oct. 14-19, 1990 disclosed the use of polymeric materials in supercapacitors which could actually function as batteries. Therefore, the use of these emerging technologies to provide an integrated battery built into or as part of an equipment housing would result in smaller overall size, lighter overall weight, and lower fabrication cost of the portable equipment.

SUMMARY OF THE INVENTION

Accordingly, a battery integrally formed in a substrate, comprises a first current collector embedded in the substrate and further coupled to a first electrode, a second current collector coupled to a second electrode and a solid state electrolyte between the first electrode and the second electrode.

DETAILED DESCRIPTION OF THE PREFERRED EMBODIMENT

Figure 1:
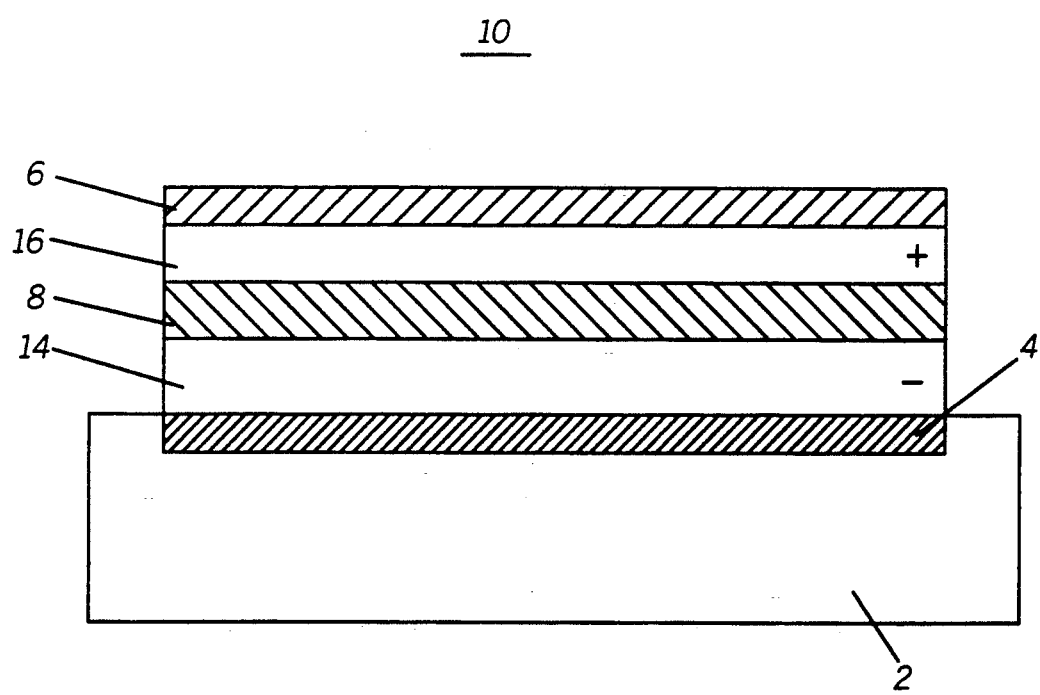
FIG. 1 is a cross-sectional view of an integral solid state inlaid battery in accordance with the present invention.

Referring to FIG. 1, there is shown a battery 10 having a positive end terminal or current collector 6 and negative end terminal or current collector 4. A current collector, either positive or negative, is inlaid or molded into a member 2 which can be a housing, a flex circuit, a substrate, or any other supporting walls found in a portable electronic product. The positive current collector 6 is coupled to a positive electrode 16. The positive current collector and positive electrode, in combination, is commonly referred to as the cathode. Likewise, the negative current collector 4 is coupled to a negative electrode 14, and their combination is commonly referred to as the anode. In this embodiment, the negative current collector 4 is inlaid or molded into the member 2, but likewise, if so desired, the positive current collector 6 could be imbedded in member 2. In other words, either the negative or positive current collector is an integral inlaid component of the housing or substrate.

Between the anode and the cathode is a solid electrolyte 8 preferably made from such conductive polymer materials as polyethyleneoxide (PEO), polyphosphazene, polyether-substituted phosphazene (MEEP), or polypropyleneoxide. Coupled between the electrolyte 8 and the positive current collector 6 is a positive electrochemically active material such as a positive electrode 16. Coupled between the electrolyte 8 and the negative current collector 4 is a negative electrochemically active material such as a negative electrode 14. Although FIG. 1 shows only one collector embedded in the member 2, it is within contemplation of the present invention that other portions of the battery 10 (i.e., electrode 14, electrolyte 8, electrode 16, and collector 6) could be embedded within the member 2.

Figure 4:
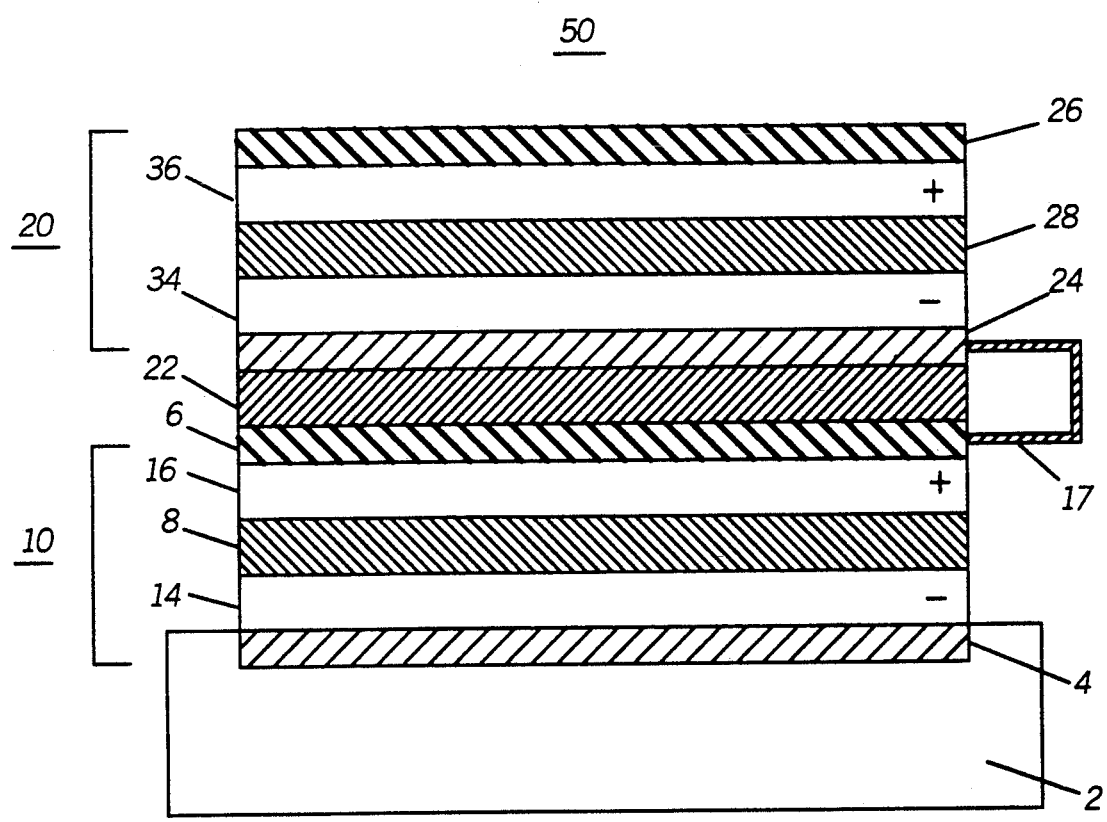
FIG. 4 is a cross-sectional view of a group of solid state cells in accordance with the present invention.

The embodiment of FIG. 1 illustrates one cell, but several cells can be laid in series (as seen in FIG. 4) with as many layers of positive electrode, solid electrolyte, and negative electrode as required for an overall desired battery voltage. Likewise, the inlaid battery, in accordance with the present invention could be configured in a parallel connection to achieve an overall desired battery capacity. A bipolar arrangement with one current collector for one electrode common to two cells could also be configured. The solid electrolyte would provide insulation to separate these connections. Thus, in any of these configurations, the elimination of the outside metallic case of each cell and the elimination of the outer packaging for the overall battery provides a considerable reduction in volume and weight in a portable product. The result is a high energy density, self-powered portable electronic product. Furthermore, since the electrolyte is in a solid state, no contamination or leakage to the portable product componentry will occur.

Referring to FIG. 4, the embedded battery 50 comprises a first cell 10 as described in reference to FIG. 1, electronically coupled to a second cell 20 in series. The second cell 20 comprises, similar to cell 10, a negative current collector 24 coupled to a negative electrode 34 forming a anode, a positive current collector 26 coupled to a positive electrode 36 forming an cathode, and a solid state electrolyte 28 between the cathode and anode. The cell 10 is separated from cell 20 by an insulation means such as the separator 22. The separator 22 typically comprises of polyethylene or other thin nonconductive material. Finally battery 50 comprises of an intercell connection means such as the connector 17, typically made from an electrically conductive metal such as nickel. As previously mentioned, although a series coupling between cells is described, parallel and bipolar coupling arrangements between cells are within contemplation of the present invention.

Figure 2:
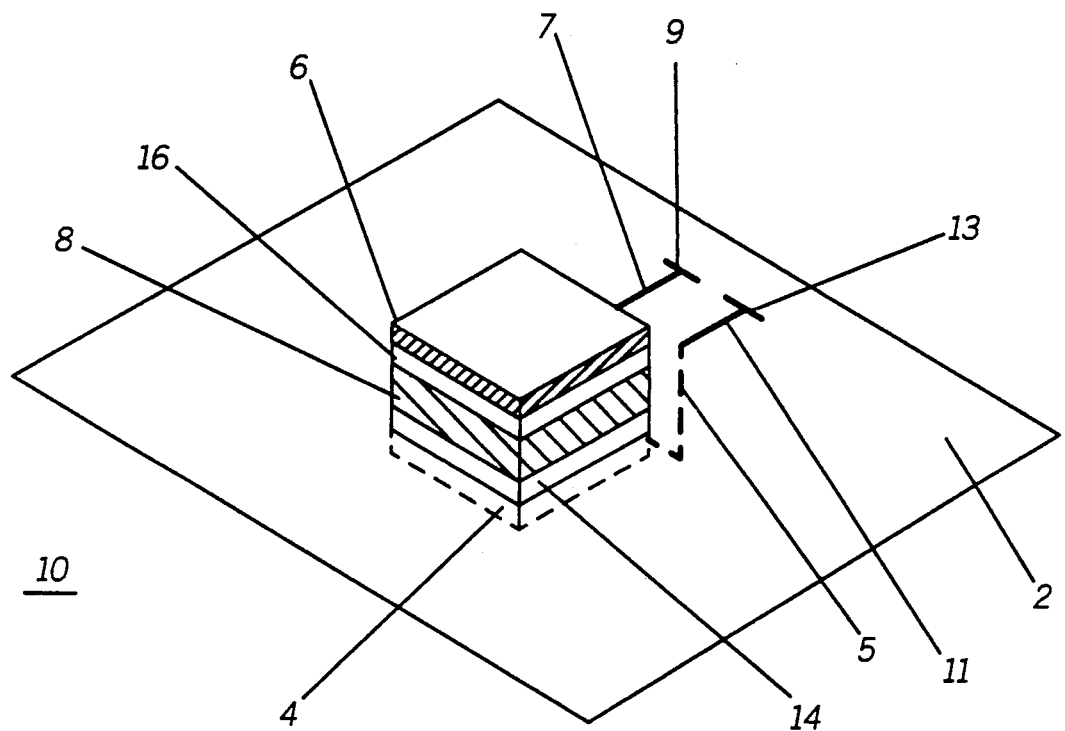
FIG. 2 is a perspective view of the battery of FIG. 1.
Figure 3:
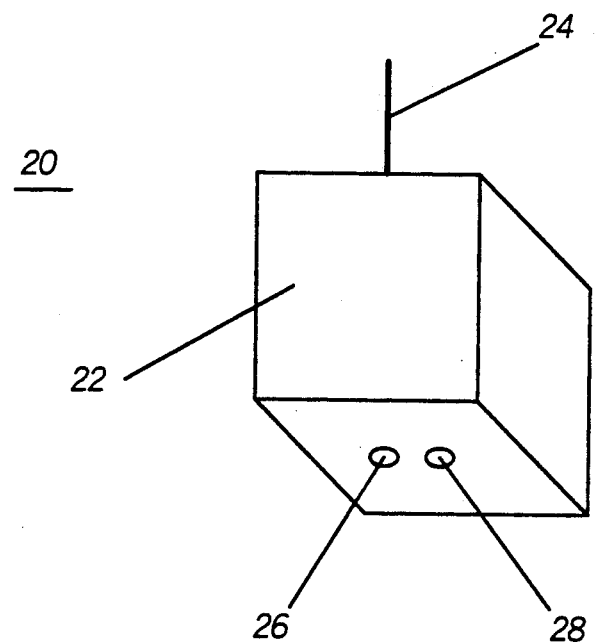
FIG. 3 is simple perspective view of a radio for use in accordance with the present invention.

Referring to FIG. 2 and FIG. 3, the battery 10 is shown embedded in a radio housing 2. The battery 10, as previously described above, comprises a current collector 6 coupled to an electrode 16, another current collector 4 coupled to an electrode 14, and an electrolyte 8 coupled between electrodes 14 and 16. In this embodiment, the positive current collector 6 is coupled to a conductive pad or contact 9 via a conductive runner 7. Likewise, the negative current collector is coupled to a conductive pad or contact 13 via a conductive runner 11. A portion (5) of the conductive runner 11 (shown in dashed lines) is also embedded in the radio housing 2. FIG. 3 illustrates a typical radio 20 that could be used in conjunction with the present invention. Preferably, the radio 20 includes a housing 22, an antenna 24, and contacts 26 and 28 that would couple with the contacts 9 and 13. Of course, other arrangements having the battery 10 on other housing walls or in printed circuit boards or flex circuits within the housing 22 is within contemplation of the present invention.

What is claimed is:

1. A battery integrally formed in a substrate, comprising:
   a first current collector embedded in said substrate and further coupled to a first electrode;
   a second current collector coupled to a second electrode; and
   a solid state electrolyte between said first electrode and said second electrode.

2. The battery of claim 1, wherein said substrate comprises a flexible circuit carrying substrate.

3. The battery of claim 1, wherein said substrate comprises a portion of a housing.

4. The battery of claim 1, wherein said first current collector is selected from the group consisting of expanded metal, metal screens, and metal foils, wherein the metal foil is selected from the group consisting of nickel, copper, aluminum, chromium, and combinations thereof.

5. The battery of claim 1, wherein said second current collector material is selected from the group consisting of expanded metal, metal screens, and metal foils, wherein the metal foil is selected from the group consisting of nickel, copper, aluminum, chromium, and any combinations thereof.

6. The battery of claim 1, wherein said first electrode material is selected from the group consisting of lithium and lithium alloys, lithiated carbon (lithium ion) compounds, and doped lithium polymers, wherein the doped lithium polymer is selected from the group consisting of polyphenylene, polypyrrole, and polyaniline and their derivatives.

7. The battery of claim 1, wherein said second electrode material is selected from the group consisting of metal chalcogenides, wherein the metal chalcogenide is selected from the group consisting of titanium disulfide, vanadium oxides, doped lithium polymers, and redox polymers.

8. The battery of claim 1, wherein said solid state electrolyte is selected from the group consisting of conductive polymer materials, wherein the conductive polymer material is selected from the group consisting of polyethyleneoxide (PEO), polyphosphazene, polyether-substituted phosphazene (MEEP), and polypropyleneoxide.

9. A laminar battery forming an integral part of a portable electronic product, comprising:
   a member of said portable product for receiving said laminar battery;
   a group of solid state cells electrically coupled together, each cell comprising an anode, a cathode, and a solid electrolyte between said anode and cathode, said cathode comprising of a first current collector and a positive electrochemically active material, said anode comprising of a second current collector and a negative electrochemically active material, one of said cells being embedded in said member;
   insulation means for insulating one cell within said group from another cell within said group; and
   intercell connection means for electrically coupling said cells.

10. The battery of claim 9, wherein said member is selected from the group consisting of flex circuits, ceramic substrates, housings, and molded printed circuit boards.

11. The battery of claim 9, wherein said first current collector material is selected from the group consisting of expanded metal, metal screens, and metal foils, wherein the metal foil is selected from the group consisting of nickel, copper, aluminum, and any combinations thereof.

12. The battery of claim 9, wherein said second current collector material is selected from the group consisting of expanded metal, metal screens, and metal foils, wherein said foil is selected from the group consisting of nickel, copper, aluminum, and any combinations thereof.

13. The battery of claim 9, wherein said positive electrochemically active material is selected from the group of anode materials consisting of lithium and lithium alloys, lithiated carbon (lithium ion) compounds, and doped lithium polymers, wherein the doped lithium polymer is selected from the group consisting of polyphenylene, polypyrrole, and polyaniline and their derivatives.

14. The battery of claim 9, wherein said negative electrochemically active material is selected from the group of cathode materials consisting of metal chalcogenides, wherein the metal chalcogenide is selected from the group consisting of titanium disulfide, vanadium oxides, doped lithium polymers, and redox polymers.

15. The battery of claim 9, wherein said solid state electrolyte is selected from the group consisting of conductive polymer materials, wherein the conductive polymer material is selected from the group consisting of polyethyleneoxide (PEO), polyphosphazene, polyether-substituted phosphazene (MEEP), and polypropyleneoxide.

16. The laminar battery of claim 9, wherein said portable electronic product comprises a radio.

17. A radio having a battery integrally formed in a member within the radio, comprising:
   a first current collector inlaid in said member and further coupled to a first electrode;
   a second current collector coupled to a second electrode;
   a solid state electrolyte between said first electrode and said second electrode.

18. The radio of claim 17, wherein said member comprises a substrate within said radio.

19. The radio of claim 17, wherein said member comprises the housing of the radio.

* * * * *